United States Patent
Singerl et al.

(10) Patent No.: US 7,657,405 B2
(45) Date of Patent: Feb. 2, 2010

(54) METHOD FOR DETERMINING A MODEL FOR AN ELECTRICAL NETWORK AND USE OF THE METHOD

(75) Inventors: Peter Singerl, Villach (AT); Gernot Kubin, Graz (AT)

(73) Assignee: Infineon Technologies AG, Munich (DE)

( * ) Notice: Subject to any disclaimer, the term of this patent is extended or adjusted under 35 U.S.C. 154(b) by 492 days.

(21) Appl. No.: 11/413,491

(22) Filed: Apr. 28, 2006

(65) Prior Publication Data

US 2006/0264187 A1 Nov. 23, 2006

(30) Foreign Application Priority Data

May 2, 2005 (DE) .................. 10 2005 020 318

(51) Int. Cl.
*G06F 17/50* (2006.01)
(52) U.S. Cl. .................. 703/2; 703/17; 381/59
(58) Field of Classification Search ............. 703/2, 703/17; 708/300; 381/59
See application file for complete search history.

(56) References Cited

U.S. PATENT DOCUMENTS

| | | | |
|---|---|---|---|
| 4,344,093 A | * | 8/1982 | Huber .................. 360/45 |
| 5,047,969 A | | 9/1991 | Sloane |
| 6,349,272 B1 | * | 2/2002 | Phillips .................. 703/2 |
| 2003/0046045 A1 | | 3/2003 | Pileggi et al. |
| 2004/0210789 A1 | * | 10/2004 | Kusunoki .................. 713/400 |
| 2005/0021319 A1 | * | 1/2005 | Li et al. .................. 703/2 |
| 2006/0274904 A1 | * | 12/2006 | Lashkari .................. 381/59 |

FOREIGN PATENT DOCUMENTS

| | | |
|---|---|---|
| DE | 36 14 785 A1 | 1/1988 |
| DE | 600 06 102 T2 | 7/2004 |
| EP | 0 243 898 B1 | 11/1987 |
| EP | 0 168 078 B1 | 1/1991 |
| EP | 0 939 487 A2 | 1/1999 |
| EP | 1 128 293 A2 | 8/2001 |
| EP | 1 280 272 B1 | 1/2005 |

* cited by examiner

*Primary Examiner*—Thai Phan
(74) *Attorney, Agent, or Firm*—Eschweiler & Associates, LLC (57) ABSTRACT

An electrical network having a nonlinear transfer response is approximated with a system with memory. The system with memory being approximated in the frequency domain and subsequently being expanded in the time domain. A transfer response of the system being approximated to a transfer response of the electrical network in a range of a system bandwidth corresponding to an input signal bandwidth. The resulting model has adjustable parameters and can readily be implemented in the form of a dynamically linear filter and a static nonlinearity (B2) connected thereto.

20 Claims, 3 Drawing Sheets

METHOD FOR DETERMINING A MODEL FOR AN ELECTRICAL NETWORK AND USE OF THE METHOD

REFERENCE TO RELATED APPLICATIONS

This application claims the benefit of the priority date of German application DE 10 2005 020 318.3, filed on May 2, 2005, the contents of which are herein incorporated by reference in their entirety.

FIELD OF THE INVENTION

Methods for determining models representing an electrical networks and the use of such methods.

BACKGROUND OF THE INVENTION

In modern communication systems it is endeavored to use electrical components which are as cost-effective as possible and the power loss of which is moreover low. One example of such a component is a radiofrequency power amplifier in mobile radio base stations. Base stations require corresponding output powers for their transmission signals of up to 200 watts. These output powers are provided by radiofrequency power amplifiers for base stations, which are among the most expensive individual components of a base station. In order to operate such amplifiers in a range with high efficiency, it is expedient to use the transistors of the radiofrequency power amplifiers in a nonlinear range of their characteristic curve. The term nonlinear range is understood hereinafter to mean that range of the transfer characteristic curve of an electrical component which has a nonlinear transfer response, that is to say in which the amplitude and the phase of the output signal are not proportional to the amplitude and phase of the input signal.

Operating a component in a nonlinear range of its transfer characteristic curve generates a distortion on account of an intermodulation, that is to say a mutual influencing of individual signal components of the input signal. This causes additional frequencies and hence a spectral broadening of the signal output by the component, which can undesirably influence the adjacent channels. In order to avoid intermodulation, it would be possible for example for a power amplifier of the base station to be dimensioned correspondingly and to be modulated in a linear range of its characteristic curve. However, this variant is not recommendable on account of the large chip area in production and the high costs and also owing to low efficiency in operation.

Another possibility for reducing a distortion of the signal to be transmitted includes predistorting the signal to be output. This efficient and very flexible linearization variant is also referred to as "digital predistortion". In this case, a predistorted signal rather than the actual undistorted useful signal is fed to the amplifier. Owing to the nonlinear transfer response of the power amplifier, the input signal is distorted again. Given a suitable choice of the predistortion, the distortion caused by the amplifier is compensated for, so that the desired amplified useful signal can be tapped off on the output side. A distortion is achieved by a circuit connected upstream of the input of the radiofrequency power amplifier. This "predistorter" distorts the signal to be transmitted in a suitable manner, thereby correcting the distortion on account of the nonlinear transfer response in the radiofrequency power amplifier.

Figure 4:
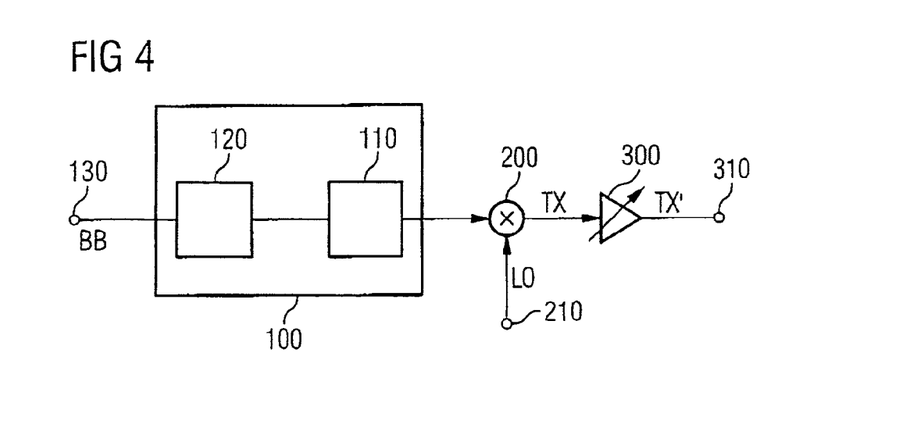
FIG. 4 illustrates a block diagram of a transmission path with a digital predistortion.

FIG. 4 shows a block diagram with elements in the transmission signal path of a base station. The data BB to be transmitted are fed to a baseband unit 100 at an input 130. The baseband unit 100 contains a modulator 120, inter alia, which codes the data to be transmitted in accordance with a predetermined type of modulation. The type of modulation is prescribed by a mobile radio standard. The coded data are referred to as the digital baseband signal. They are fed to a predistorter 110, which alters an amplitude and, if appropriate, a phase of the digital baseband signal in order to take account of the nonlinear transfer response of components connected downstream.

The predistorted baseband signal that is output is converted into an analog signal and converted onto a carrier frequency by means of a mixer 200 with the aid of a local oscillator signal LO at the input 210. In this case, the mixer 200 may contain different circuits, e.g. an IQ modulator or a polar modulator. Afterward, the frequency-converted signal TX is amplified to the desired output power in a power amplifier 300 and the amplified signal TX' is output. The radiofrequency power amplifier 300 is operated in a nonlinear range for the signal amplification. Owing to the predistortion of the signal to be amplified by the predistorter 110, the distortions on account of the nonlinear transfer response are ideally compensated for. An approximately undistorted useful signal TX' on the carrier frequency with the desired output power is present at the output 310.

In order to determine predistortion coefficients which are required for the predistortion of the useful signal, it is expedient for the transfer response, of the electrical components, for example of the radiofrequency power amplifier 300, to be described as accurately as possible. This description generally represents a complex problem since the transfer response of the radiofrequency power amplifier and hence its characteristic curve, as already mentioned, is nonlinear. In addition, the amplifier often has dynamic effects. The dynamic effects essentially arise as a result of a "memory" of the radiofrequency power amplifier. Thus, the signal present on the input side influences the output signal of the power amplifier. The output signal at one point in time is accordingly dependent on the input signal at this point in time and relative to a preceding temporal profile of the input signal.

SUMMARY OF THE INVENTION

By means of the description of the real radiofrequency power amplifier with a suitable model which maps the nonlinear transfer response and the memory of the radiofrequency amplifier as accurately as possible, the necessary predistortion coefficients can be calculated very dynamically and flexibly, while the radiofrequency power amplifier can continue to be operated in parallel with the calculation.

A method for accurately determining a model of an electrical network having a nonlinear dynamic transfer response with few free parameters is disclosed, as is a use for the method.

A system with memory is assigned to a physical electrical network having a nonlinear dynamic transfer response and comprising an input for feeding in an input signal having an input signal bandwidth and also an output for outputting an output signal. The system with memory has a system bandwidth essentially corresponding to the transfer bandwidth of the electrical network. In order to prepare the system assigned to the electrical network for different applications, the system maps the nonlinear dynamic transfer response of the electrical network accurately. For this purpose, the system is approximated, that is to say matched to the real nonlinear dynamic transfer response of the electrical network.

Provision is made for performing an approximation of the system to the nonlinear transfer response not, however, in the complete range of the system bandwidth, but rather in a range of the system bandwidth corresponding to the signal bandwidth of the input signal. Since, in many real electrical networks, the transfer bandwidth is significantly greater than a signal bandwidth of an input signal fed in, it suffices, in the case of the system with memory that is assigned to the electrical network to carry out an approximation in a range of the system bandwidth corresponding to the input signal bandwidth. The system assigned to the electrical network is matched to the transfer response of the electrical network in the range of the input signal bandwidth.

A system with memory is determined which, in a range of its system bandwidth, is matched to the nonlinear dynamic transfer response of the electrical network, at the same time a small number of parameters are required for the matching. The method thus permits an approximation to the electrical network with a sufficient accuracy of the system and at the same time a reduction of the parameters necessary for describing the system.

A system with memory that is approximated in this way can then be implemented as a model. The model which has significantly simpler components, likewise represents an electrical network which can be used to simulate the transfer response of the electrical network assigned to the system with memory.

The system with memory can be described by a complex baseband series. The latter is embodied as a sum of individual terms. The number of terms of the sum preferably specifies an order of a nonlinearity of the system with memory. The order specified by the number of terms corresponds to the order of the nonlinear transfer response of the electrical network. By expanding the terms of the sum for describing the system with memory by means of suitable functions, an accurate approximation of the system to the nonlinear transfer response can be achieved in a range of the system bandwidth of the system with memory corresponding to the model signal bandwidth.

The model can be determined by representing the system with memory by means of a complex baseband Volterra series. This Volterra series contains a number of Volterra kernels, the number of kernels corresponding to the order of a nonlinearity of the system. In one example, the Volterra kernels of the Volterra series are expanded in the frequency domain by means of suitable functions. After this expansion, the Volterra kernels expanded in functions are transformed back into the time domain.

The expansion in the frequency domain and the renewed representation in the time domain result in a compact representation for a dynamic nonlinear model which describes the input and output response of the electrical network assigned to the system with memory with a small number of free parameters. In one example, the Volterra kernels of the Volterra series are expanded by means of suitable functions in the range of the model signal bandwidth such that the kernels approximate well the nonlinear transfer response in the range of the model signal bandwidth. Use can be made of orthogonal polynomials such as, for example, Legendre polynomials, Chebyshev polynomials, but also Fourier series, radial basis functions and multilayer perceptrons.

In one example, for determining the system with memory, the approximation can be terminated after a series of actions. This is possible in particular when an approximation of the nonlinear transfer response of the electrical network can be achieved by means of suitable low-order functions.

The system with memory that is determined can be represented by a complex linear prefilter and a static characteristic curve. The complex linear prefilter contains the individual expanded terms of the system with memory, the number of terms specifying the order of the nonlinearity and the approximation. The linear prefilter permits a description of the dynamic range of the nonlinear electrical network within the complex baseband.

The expansion of a model which describes the nonlinear dynamic transfer response of an assigned electrical network accurately in the range of an input signal bandwidth may be suitable for various applications. In one example, the system used to determine an inverse transfer function of the assigned electrical network. Said function can be used for determining predistortion coefficients. For this purpose, in one example, a model input signal is fed to the system with memory that is determined. Said signal is processed by the system with memory and a model output signal is generated. The model output signal is passed to a system which is suitable for determining the distortion coefficients of the system with memory. Predistortion coefficients are calculated therefrom. It should be emphasized in particular that the method may also be suitable for determining a model for an electrical network for determining the predistortion coefficients. This can then be simulated with low hardware complexity including few freely adjustable parameters.

A physical electrical network having a nonlinear transfer response can thus be approximated by a system with memory by expanding the system in the time domain, a transfer response of the system being approximated to a transfer response of the electrical network in a range of a system bandwidth corresponding to an input signal bandwidth. The resulting model has freely adjustable parameters and can be readily be implemented in the form of a dynamic linear filter and a static nonlinearity connected thereto.

BRIEF DESCRIPTION OF THE DRAWINGS

The invention is explained in more detail below wherein reference is made to the following drawings.

DETAILED DESCRIPTION OF THE INVENTION

One or more examples will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding. It will be appreciated that variations of the illustrated systems and methods apart from those illustrated and described herein may exist and that such variations are deemed as falling within the scope of the appended claims.

In the design and development phase of real electrical networks, it has proven advantageous to develop systems which simulate the underlying electrical network as accurately as possible and that predict a distortion on account of nonlinear effects in the underlying electrical network. Examples of electrical networks which have a nonlinear transfer response are radiofrequency amplifiers, power amplifiers, filters, mixers and other circuits which contain components having nonlinear transfer characteristic curves.

The term a nonlinear transfer response is used inter alia for a property which is associated with the ratio of an output power of an electrical network to its input power. If the power of the output signal is proportional to the power of the input signal, this is referred to as a linear transfer response. This means that the power of the output signal changes proportionally to the power of the input signal. The phase of the output signal is independent of the input power. However, if the output signal contains a nonproportional component, the electrical network has a nonlinear transfer response. The output signal phase becomes dependent on the input power. The signals are represented physically by a time-variable voltage or a time-variable current.

In an exemplary method described herein, a system is assigned to the electrical network to be described. The system is accurately matched to the nonlinear transfer response of the electrical network with the aid of one or more methods. In this arrangement, reference is also made to the fact that the electrical network is described by the system. It is advantageous to obtain an accurate description of the electrical network by the system to facilitate accurate predictions.

One example of a system for describing an electrical network is the "quasi-memoryless" model. The latter describes the nonlinear transfer response of the assigned electrical network by means of two static nonlinearities referred to as "AM/AM" and "AM/PM" distortion. The complex output signal of the static nonlinearities is dependent on the magnitude of the complex envelope of the signal fed to the electrical network or of the model signal fed to the model, that is to say essentially on the amplitude of the input signal. In practice, the static nonlinearities can be measured by exciting the electrical network with a sinusoidal tone, that is to say with a signal at a single frequency. This model cannot be used in the case of electrical networks with memory having a dynamic nonlinear transfer response in which the complex output signal at one point in time is dependent on the temporal profile of the signal present on the input side from the past up to this point in time. The model exhibits just as little practicability if a broadband signal having a multiplicity of frequencies is used as the real input signal for the electrical network, for example for a WCDMA signal or an OFDM signal.

Electrical networks which are suitable for broadband applications can be described for example by a model which is represented by a complex baseband Volterra series. Such a model has the advantage that it also accounts for dynamic effects. However, a model for describing an electrical network in the form of a complex baseband Volterra series has a high complexity with a multiplicity of adjustable parameters. In particular, the complexity rises exponentially with the order of the nonlinearity to be described.

An electrical network is thus described herein having a dynamic nonlinear transfer response by means of a model with a baseband Volterra series, the individual terms of the Volterra series being suitably approximated in the frequency domain. As a result, the number of parameters and hence the complexity can be reduced if the Volterra kernels do not have severe fluctuations in the frequency domain over the input signal bandwidth.

This is generally the case when the system bandwidth of the electrical network is very large in relation to a signal bandwidth of an input signal. This is often the case with typical signals, such as, for example, with WCDMA signals or OFDM signals. By way of example, the system bandwidth of the electrical network is a few hundred MHz, while the UMTS/WCDMA signal or an 802.11.b signal has a bandwidth of 20 MHz, for example. This property permits the approximation of the model with the baseband Volterra series in the range of the input signal bandwidth and not, as is otherwise necessary, in the complete range of the system bandwidth of the electrical network.

The Volterra kernels in the frequency domain of the input signal bandwidth which represent a "smooth" multidimensional function can be approximated very accurately in the model by an expansion of the Volterra kernels with low-order multidimensional polynomials. Instead of low-order multidimensional orthogonal polynomials, it is also possible to use other functions such as, for example, Fourier series, radial basis functions or multilayer perceptrons. All that is necessary is that the function to be approximated does not have severe fluctuations within the input signal bandwidth.

The nonlinear transfer response of the electrical network is approximated accurately in the range of the input signal bandwidth by the expansion of the system assigned to the electrical network with the functions mentioned above. The number of free parameters necessary for description is thus significantly reduced. In other words, the approximation in the frequency domain in which the input signal varies rather than over the entire range results in a high accuracy with a small number of adjustable coefficients. The model thus created accordingly maps the real transfer response of the electrical network very accurately in the range of the input signal bandwidth.

Such a system is also accurate outside the input signal bandwidth, that is to say that a separate approximation is not necessary there. This follows from the fact that the spectral components of the output signal are not caused by the transfer response of the electrical network outside the input signal bandwidth, but rather by the convolution of the weighted input signal components within the input signal bandwidth with themselves. Consequently, an accurate approximation of the nonlinear transfer response outside the input signal bandwidth is not necessary to accurately represent the transfer response in the frequency domain of the input signal.

In addition, owing to the use of orthogonal polynomials for the approximation of the individual terms of the Volterra series, the expanded model and in particular the bandwidth thereof can be matched to an arbitrary bandwidth of the input signal by means of a linear transformation. Therefore, the expanded model is in principle bandwidth-variable.

Figure 5:
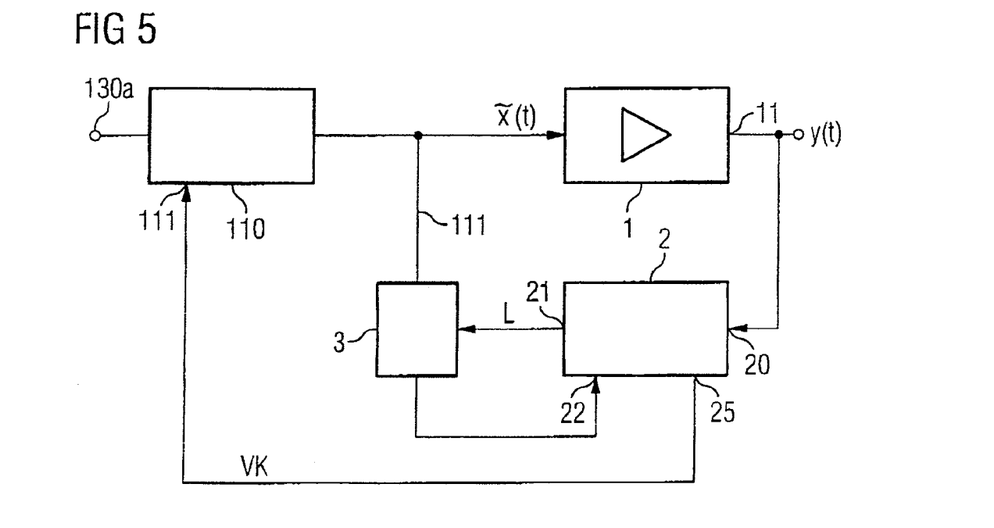
FIG. 5 illustrates a schematic representation of a learning architecture for an application of a method disclosed herein.

FIG. 5 illustrates a model for a dynamic nonlinear power amplifier which is represented in its bandpass frequency domain by a series circuit comprising a dynamically nonlinear system and dynamically linear system. The way in which the model of FIG. 5 is generated from a real electrical network is explained below.

A electrical network having a nonlinear transfer response, in particular a power amplifier, can be described by a combination of a dynamically nonlinear system and a dynamically linear system. The dynamically nonlinear system is represented by an operator H, and the dynamically linear system is represented by an operator F. The model input signal x(t) is represented by $$x(t) = a(t)\cos(\omega_c t + \phi(t)),$$

where $\omega_c$ represents the carrier frequency, $\Phi(t)$ represents the time-dependent phase and a represents the time-dependent amplitude of the model input signal. The signal is fed into the nonlinear dynamic system with the operator H. The output signal u(t) can be described by:

$$u(t) = H[x(t)] = \sum_{n=1}^{N} u_n(t) \quad (1)$$

$$u_n(t) = \int_0^\infty \cdots \int_0^\infty h_n(\tau_1, \ldots, \tau_n) \prod_{i=1}^n x(t-\tau_i) d\tau$$

The output signal u(t) is therefore a sum of a plurality of components $u_n(t)$. Each of the components is described by a Volterra integral $u_n(t)$, where the number N of terms of the sum specifies the order of the nonlinearity. The coefficients $h_n$ in each Volterra integral represent the Volterra kernels of the order n.

The output signal y(t) of the overall system comprising the dynamically nonlinear system and the dynamically linear system is described by:

$$y(t) = FH[x(t)] = \sum_{n=1}^{N} F[u_n(t)] \quad (2)$$

where the operator F describes the transfer function of a linear bandpass filter. The latter suppresses the repeat spectra at the multiples of the carrier frequency.

Owing to the bandpass nature of the input signal x(t), each even order of the nonlinearity of the operator H generates spectral components at even multiples of the carrier frequency $\omega_c$. An odd-order nonlinearity of the operator H leads to spectral components at the odd multiples of the carrier frequency. If the carrier frequency $\omega_c$ is greater than B(2N−1), where 2B is the signal bandwidth of the bandpass signal x(t), a baseband Volterra system exists where:

$$\tilde{y}(t) = \sum_{k=0}^{[N/2]-1} \int_0^\infty \cdots \int_0^\infty \tilde{h}_{2k+1}(\tau_1, \ldots, \tau_{2k+1}) \times \quad (3)$$

$$\prod_{i=1}^{k+1} \tilde{x}(t-\tau_i) \prod_{i=k+2}^{2k+1} \tilde{x}_*(t-\tau_i) d\tau_1 \ldots d\tau_{2k+1}$$

This is equivalent to the output signal in equation 2. The signals $\tilde{x}$, $\tilde{y}$ and the Volterra kernel $\tilde{h}_{2k+1}$ merely represent the baseband quantities. $\tilde{x}*$ is the complex conjugate of the baseband quantity $\tilde{x}$.

In many practical applications, the excitation signal, in the form of the input signal, has a relatively narrow bandwidth in comparison with the system bandwidth of the electrical network. At the same time, the carrier frequency $\omega_c$ is significantly greater than the maximum component occurring in baseband. As a result, equation (3) can be used for a baseband description. For the approximation it is expedient to choose suitable functions in order to expand the Volterra kernels $\tilde{h}_{2k+1}$ represented in equation (3) in the frequency domain. For this purpose, as explained below, the Volterra kernels are expanded with multidimensional functions.

If the kernels FT{$\tilde{h}$} Fourier-transformed into the frequency domain are "smooth" in the range of the signal bandwidth of the excitation signal, that is to say have no oscillations, it is possible to approximate said kernels with a small number of parameters. Assuming a "smooth" range is expedient, as explained further below. Firstly, for the determination, the time domain representation of the baseband output signal $\tilde{y}(t)$ in equation (3) is transformed into the frequency representation with the aid of a Fourier transformation. The following holds true:

$$\tilde{Y}_{2k+1}(\omega_1, \ldots, \omega_{2k+1}) = \quad (4)$$

$$\int_0^\infty \cdots \int_0^\infty \tilde{y}_{2k+1}(t_1, \ldots, t_{2k+1}) \times \exp\left(-j \sum_{i=1}^{2k+1} \omega_i t_i\right) dt_1 \ldots dt_{2k+1}$$

$\tilde{y}_{2k+1}$ represents the Fourier-transformed function of the 2k+1 dimensional complex output signal $\tilde{y}_{2k+1}(t_1, \ldots, t_{2k+1})$.

The multidimensional signal $\tilde{y}_{2k+1}(t_1, \ldots, t_{2k+1})$ in the time domain with its components in equation (4) can be expressed by:

$$\tilde{y}_{2k+1}(t_1, \ldots, t_{2k+1}) = \int_0^\infty \cdots \int_0^\infty \tilde{h}_{2k+1}(\tau_1, \ldots, \tau_{2k+1}) \times \quad (5)$$

$$\prod_{i=1}^{k+1} \tilde{x}(t_i - \tau_i) \prod_{i=k+2}^{2k+1} \tilde{x}_*(t_i - \tau_i) d\tau_1 \ldots d\tau_{2k+1}$$

It is evident that the sum of all $\tilde{y}_{2k+1}$ produces the baseband output signal $\tilde{y}(t)$.

Consequently, the following results for the 2k+1 dimensional baseband signal $\tilde{y}_{2k+1}(t_1, \ldots, t_{2k+1})$:

$$\tilde{Y}_{2k+1}(\omega_1, \ldots, \omega_{2k+1}) = \quad (6)$$

$$\tilde{H}_{2k+1}(\omega_1, \ldots, \omega_{2k+1}) \times \prod_{i=1}^{k+1} \tilde{X}(\omega_i) \prod_{i=k+2}^{2k+1} \tilde{X}_*(-\omega_i)$$

where $\tilde{H}_{2k+1}$ is the Fourier transform of the complex baseband Volterra kernel $\tilde{h}_{2k+1}$. $\tilde{X}$ represents the Fourier transform of the baseband input signal $\tilde{x}$.

Over the frequency domain of the input signal, individual Volterra kernels $\tilde{H}$ in equation (6) can then be expanded by means of multidimensional orthogonal polynomials. The functions $T_i(w)$ used in this case are orthogonally real functions which can be expressed by the orthogonality relationship $$\int_{-B}^{B} p(\omega) T_n(\omega) T_m(\omega) d\omega = \begin{cases} \lambda_n & \text{if } m = n \\ 0 & \text{if } m \neq n \end{cases} \quad (7)$$

The following holds true:

$$\hat{H}_{2k+1}(\omega_1, \ldots, \omega_{2k+1}) = \sum_{m_1=0}^{M_{2k+1}} \ldots \sum_{m_{2k+1}=0}^{M_{2k+1}} c_{m_1,\ldots,m_{2k+1}} \times T_{m_1}(\omega_1) \ldots T_{m_{2k+1}}(\omega_{2k+1}) \quad (8)$$

where $\tilde{H}_{2k+1}(\omega_1, \ldots, \omega_{2k+1})$ represents an approximation with the functions Ti of the kernel $\hat{H}_{2k+1}(\omega_1, \ldots, \omega_{2k+1})$.

The real function $p(\omega)$ in the orthogonality relationship represents a weighting which is dependent on the orthogonal functions respectively used. The selected polynomials are orthogonal in a range $[-B; B]$ of the frequency domain. This range corresponds to the signal bandwidth of the input signal.

The approximation with orthogonal polynomials avoids the problem of a limited convergence associated with non-orthogonal series expansions such as, for example, Taylor polynomials. The convergence criterion can be fulfilled significantly more simply in the present case. To establish suitable orthogonal polynomials the square error is reduced from the term $$\int_{-B}^{B} \ldots \int_{-B}^{B} p(\omega_1) \ldots p(\omega_{2k+1}) \times$$
$$\left|\tilde{H}(\omega_1, \ldots, \omega_{2k+1}) - \hat{H}(\omega_1, \ldots, \omega_{2k+1})\right|^2 \times d\omega_1 \ldots d\omega_{2k+1}$$

with regard to the coefficients $c_{m_1,\ldots,m_{2k+1}}$.

If the approximated Volterra kernels $\hat{H}_{2k+1}$ expanded in this way in equation (8) are inserted into equation (6), it is possible, by means of a corresponding inverse transformation, to determine the 2k+1 component of the approximated output signal $\tilde{y}_{2k+1}(t)$ in the time domain. The following holds true:

$$\hat{y}_{2k+1}(t_1, \ldots, t_{2k+1}) = FT^{-1}\{\hat{Y}_{2k+1}(\omega_1, \ldots, \omega_{2k+1})\} \quad (9)$$

where $\hat{Y}_{2k+1}(\ldots)$ represents the approximation from equation (6).

The operator $FT^{-1}$ represents the inverse Fourier transformation. This leads to the expression $$y_{2k+1}(t_1, \ldots, t_{2k+1}) = \sum_{m_1=0}^{M_{2k+1}} \ldots \sum_{m_{2k+1}=0}^{M_{2k+1}} c_{m_1,\ldots,m_{2k+1}} \times FT^{-1}\{T_{m_1}(\omega_1)\tilde{X}(\omega_1)\} \ldots \times \quad (10)$$
$$FT^{-1}\{T_{m_{k+1}}(\omega_{k+1})\tilde{X}(\omega_{k+1})\} \times FT^{-1}\{T_{m_{k+2}}(\omega_{k+2})\tilde{X}*(-\omega_{k+2})\} \ldots \times$$
$$FT^{-1}\{T_{m_{2k+1}}(\omega_{2k+1})\tilde{X}*(\omega_{2k+1})\}$$

If the method of splitting the time domain function into 2k+1 dimensions is reversed, the following is obtained for the approximated baseband output signal $\hat{y}$ having the order 2k+1:

$$\hat{y}_{2k+1}(t) = \hat{y}_{2k+1}(t_1 \ldots, t_{2k+1}) \quad (11)$$
$$= \sum_{m_1=0}^{M_{2k+1}} \ldots \sum_{m_{2k+1}=0}^{M_{2k+1}} c_{m_1 \ldots m_{2k+1}} \times$$
$$w_{m_1}(t) \ldots w_{m_{k+1}}(t) \times$$
$$u_{m_{k+2}}(t) \ldots u_{m_{2k+1}}(t)$$

The sum of the individual components $\hat{y}_{2k+1}(t)$ forms the total output signal $\hat{y}(t)$ where:

$$\hat{y}(t) = \sum_{k=0}^{[N/2]} \hat{y}_{2k+1}(t) \quad (12)$$

Under the condition that $0 \leq i \leq M_{2k+1}$, the time functions $w_i(t)$ and $u_i(t)$ from equation (11) are produced:

$$w_i(t) = FT^{-1}\{T_i(\omega)\tilde{X}(\omega)\}$$
$$u_i(t) = FT^{-1}\{T_i(\omega)\tilde{X}*(-\omega)\} \quad (13)$$

The time domain signals $w_i(t)$ and $u_i(t)$ in equation (13) are achieved by applying the inverse Fourier transformation to the product of the frequency domain input signal and the orthogonal polynomial having the order i. This leads to a series with complex scaled time domain input signals of different orders, where the maximum order is i.

The further consideration uses Chebeyshev polynomials which, within the desired baseband range of the input signal, are orthogonal with regard to a weighting function $$p(\omega) = \left[\sqrt{1 - \left(\frac{\omega}{B}\right)^2}\right].$$

It is also possible, of course, to use different orthogonal polynomials than the Chebeyshev polynomials represented. For Chebeyshev polynomials, the polynomials $T_0(\omega)=1$, $T_1(\omega)=\omega/B$ and $T_{n+1}(\omega)=2\omega/B T_n(\omega) - T_{n-1}(\omega)$ result given the norm factor $\eta_n$. The Chebeyshev polynomials are expressed in closed form by equation (14).

$$T_1(\omega) = \sum_{m=0}^{\lfloor i/2 \rfloor} \sum_{k=0}^{m} (-1)^k \binom{i}{2m}\binom{m}{k}\frac{\omega^{i-2k}}{B^{i-2k}} \quad (14)$$

These can be expressed in the time domain functions $w_i(t)$ and $u_i(t)$ by $$w_i(t) = \sum_{m=0}^{\lfloor i/2 \rfloor} \sum_{k=0}^{m} (-1)^k \binom{i}{2m}\binom{m}{k}\frac{\tilde{x}^{(i-2k)}(t)}{(jB)^{i-2k}} \quad (15)$$

$$u_i(t) = \sum_{m=0}^{\lfloor i/2 \rfloor} \sum_{k=0}^{m} (-1)^k \binom{i}{2m}\binom{m}{k}\frac{\tilde{x}^{(i-2k)}(t)}{(jB)^{i-2k}}$$

with the baseband input signals $\tilde{x}$ and the conjugate input signal $\tilde{x}*$.

The time domain function $u_i(t)$ can be simplified further. The following holds true:

$$u_i(t) = g(w(t)) \quad (16)$$
$$= \begin{cases} w_i(t) & \text{if } i \text{ even} \\ -\text{Re}\{w_i(t)\} + j\,\text{Im}\{w_i(t)\} & \text{if } i \text{ odd} \end{cases}$$

Figure 2:
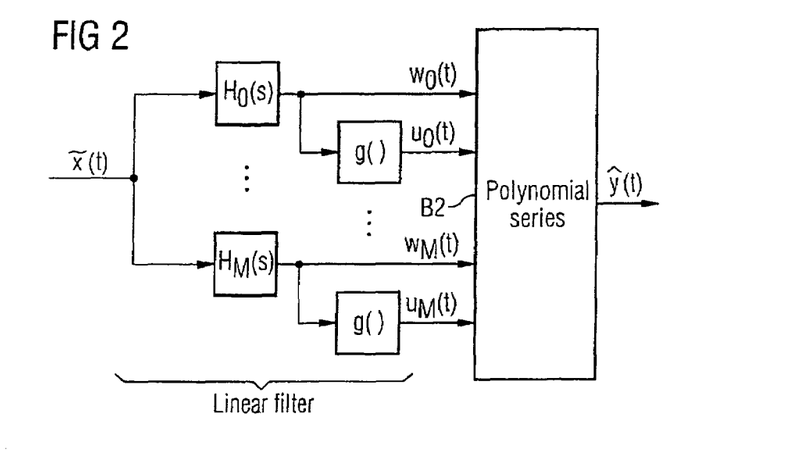
FIG. 2 illustrates a general representation of a model of a nonlinear dynamic system as determined by a method disclosed herein.

The system of an electrical network having a nonlinear transfer response, in particular of a power amplifier, that is represented in equations (1 to 12) corresponds to the model illustrated in FIG. 2. The system comprises a bank of M+1 complex linear prefilters having the respective transfer functions $H_i$. The time-dependent baseband input signal $\tilde{x}(t)$ is fed in. The output signals of the transfer functions $H_i$ form the time domain functions $w_i(t)$. By means of the operator g, the second time domain function $u_i(t)$ can be obtained therefrom in accordance with equation (16). Connected thereto, the model contains a static nonlinear model B2 to generate the polynomial series. The approximated output signal $\hat{y}$ can be tapped off at the output.

The transfer functions $H_i(s)$ result from the Laplace operator which is applied to the time domain function $w_i(t)$ of equation (15). The following holds true:

$$H_i(s) = \sum_{m=0}^{\lfloor i/2 \rfloor} \sum_{k=0}^{m} (-1)^k \binom{i}{2m}\binom{m}{k}\left(\frac{s}{jB}\right)^{i-2k} \quad (17)$$

The procedure represented here in the form of the extension of a complex Volterra series in the frequency domain and an approximation of the individual kernels by means of orthogonal polynomials in the range of the input signal bandwidth leads to the model—represented in FIG. 2—of a linear prefilter with a number of transfer functions and, connected thereto, a static nonlinear system for generating polynomial series. The individual transfer functions $H_i(s)$ in accordance with equation (17) results from the use of the orthogonal Chebeyshev polynomials in the present case. The transfer functions change in the case of approximation of the Volterra kernels with other orthogonal polynomials. The structure of the model represented in FIG. 2 comprising a linear prefilter and a static nonlinearity B2 is maintained.

For a numerical simulation it is expedient for the method represented here to be expanded in time-discrete fashion. We assume that the Fourier transform of the output signal $\tilde{y}(\omega)$ in equation (12) produces: $Y(\omega)=0$ for $\omega > \pi/T$, where $T=\pi/(NB)$. For the continuous time domain signals $\hat{y}_{2k+1}(t)$ and $\hat{y}(t)$ in equations (11) and (12) it is clear that the nonlinear response between the input signal and the output signal is given by the multiplication of the time domain signals $w_i(t)$ and $u_i(t)$ as described in equation (11). The relationship between the input signal $\tilde{X}(\omega)$ in the frequency domain and the output signals $w_i(\omega)$ and $U_i(\omega)$ in the frequency domain is defined by the Chebeyshev polynomials in accordance with equation (14). The frequency response $T_i(\exp(j\Omega))$ of the time-discrete system is periodic with $2\pi$ in the normalized frequency $\Omega=\omega t$ and is the same as the frequency response of the time-continuous system in equation (14) within $-\pi<\Omega<\pi$. The frequency domain in equation (16) can thus be transformed by $\omega \to \Omega/T$. Under the condition that $0 \leq i \leq M_{2k+1}$, the discrete time function $W_i(n)$ can be expressed by:

$$w_i(n) = \qquad (18)$$
$$\sum_{m=0}^{\lfloor i/2 \rfloor} \sum_{k=0}^{m} (-1)^k \binom{i}{2m}\binom{m}{k}\frac{1}{(jBT)^{i-2k}} * FT^{-1}\left\{\left(j\frac{\Omega}{T}\right)^{i-2k}\tilde{X}(\exp(j\Omega))\right\}$$

The inverse Fourier transformation represented in equation (18) can be expanded by a convolution. This leads to the expression for $W_i$:

$$w_i(n) = \sum_{m=0}^{\lfloor i/2 \rfloor} \sum_{k=0}^{m} (-1)^k \binom{i}{2m}\binom{m}{k}\frac{1}{(jBT)^{i-2k}} * \tilde{x}(n) * \underbrace{h(n) *, \ldots, * h(n)}_{(i-2k)x} \quad (19)$$

The functions $h(n) = FT^{-1}\{(j\Omega/T)\}$ in equation (19) describe the impulse response of a bandpass-limited time-discrete differentiator. The number of samplings of the resulting impulse response depends greatly on the highest degree of the order N, which is essentially equal to the oversampling rate of the baseband input signal $\tilde{x}(t)$. In other words, a small bandwidth results for the input signal $\tilde{x}(t)$ if the order of the nonlinearity is high. This has the effect that a small part of the frequency response of the time-discrete differentiator has to approximate the response in equation (19). This results in a time-discrete differentiator having a small number of coefficients. For the time-discrete signal $u_i(n)$, the following results on the basis of equation (16):

$$u_i(n) = g(w(n)) \qquad (20)$$

$$= \begin{cases} w_i(n) & \text{if } i \text{ even} \\ -\text{Re}\{w_i(n)\} + j\text{Im}\{w_i(n)\} & \text{if } i \text{ odd} \end{cases}$$

With equations (19) and (20), the system of a discrete electrical network, in particular of a discrete power amplifier, can be described by $$\hat{y}_{2k+1}(n) = \hat{y}_{2k+1}(n, \ldots, n) \qquad (21)$$
$$= \sum_{m_1=0}^{M_{2k+1}} \cdots \sum_{m_{k+1}=m_k}^{M_{2k+1}} \sum_{m_{k+2}=0}^{M_{2k+1}} \cdots \sum_{m_{2k+1}=m_{2k}}^{M_{2k+1}}$$
$$c_{m_1, \ldots, m_{2k+1}} \times w_{m_1}(n) \ldots w_{m_{k+1}}(n) \times$$
$$u_{m_{k+2}}(n) \ldots u_{m_{2k+1}}(n)$$

and $$\hat{y}(n) = \sum_{k=0}^{\lceil N/2 \rceil - 1} \hat{y}_{2k+1}(n) \qquad (22)$$

The transfer function as represented in equation (17) for time-continuous systems can be achieved by a Z transformation of equation (19). This leads to the transfer functions $H_t(z)$:

$$H_t(z) = \sum_{m=0}^{\lfloor i/2 \rfloor} \sum_{k=0}^{m} (-1)^k \binom{i}{2m}\binom{m}{k}\frac{1}{(jB)^{i-2k}} \times (ZT\{h(n)\})^{i-2k} \qquad (23)$$

Figure 1:
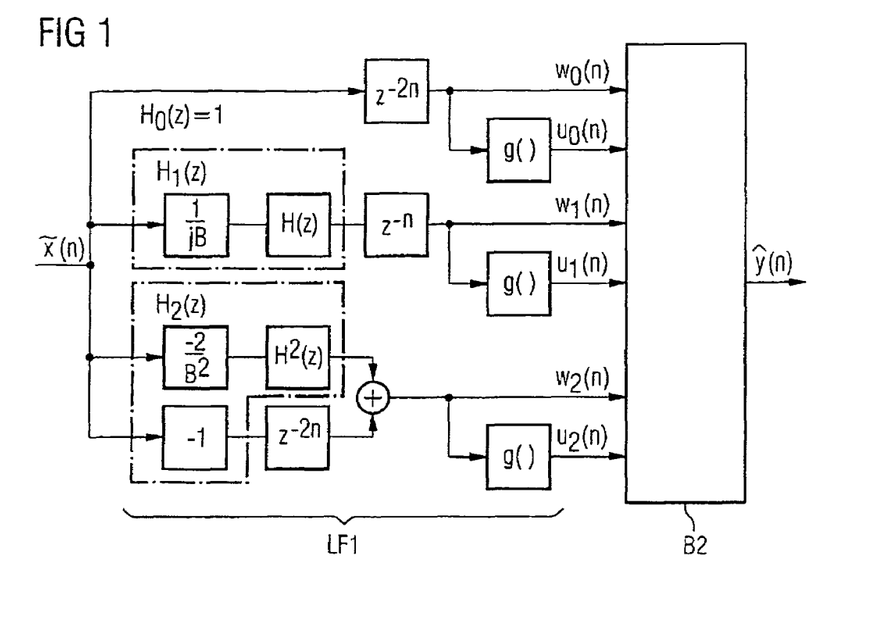
FIG. 1 illustrates a model of a nonlinear dynamic system as determined by a method disclosed herein.

FIG. 1 shows a time-discrete model—expanded by this method—of a power amplifier having a nonlinear transfer response in accordance with equation (22) with a maximum order of the nonlinearity N=2 and the transfer coefficients $H(z)=ZT\{h(n)\}$. In order to compensate for a group delay of the individual filters which represents the transfer function H(z), additional delay elements $z^{-1}$ of a different order are exerted. The model represented contains a linear prefilter LF1 containing the corresponding components $H_0(z)$, $H_1(z)$ and $H_2(z)$ of the transfer function. These are determined by the preceding method.

The task of the linear prefilter LF1 comprises modulating the dynamic range of the nonlinear radiofrequency amplifier in complex baseband. This is achieved by means of the approximated differentiators H(z). They approximate an amplitude response that rises linearly with the frequency up to input signal bandwidth, subsequently falling toward 0 again.

The individual filter coefficients of the differentiator H(z) are calculated for example by a "least-squares fit" in the frequency domain. The differentiators thus represent causal FIR filters. Their associated group delays in the individual paths have to be adapted by simple delay elements $z^{-1}$. As can be discerned, for the first path, in which the 0-order differentiator $H_0(z)$ comprises a constant transfer function, it is necessary to arrange 2n delay elements, the delay of which corresponds to the delay of the second-order system $H_2(z)$. In the case of a time-discrete model represented here, it is evident that the propagation delay must be correspondingly compensated for in those branches of the prefilters in which there is a complex gain. In the present case, a dynamic range is generated by the block that realizes the transfer function $H_2(z)$. The downstream blocks having the static functions g effect a conjugation or an inversion of the real part of the complex output signal $w_i(n)$ of the transfer functions $H_0(Z)$, $H_1(Z)$ and $H_2(z)$. The complex signals $u_i(n)$ are generated therefrom.

According to the order of the nonlinearity, which is equal to two in the example, the complex signals $w_n$ and $u_n$, in the circuit block B2, are correspondingly multiplied by one another and weighted with complex coefficients. They are also summed there to form the final output signal. Given the specified order of the nonlinearity, the number of coefficients for the weighting and the multiplication depends on the order of the approximation of the Volterra kernels used. This is determined by the number of input signals $w_i(n)$ and $u_i(n)$.

The model of a time-discrete power amplifier having a nonlinear transfer response as represented in FIG. 1 is generally valid if the bandwidth of the input signal remains constant. It can accordingly be adapted to any desired nonlinear amplifier, it merely being necessary to adapt the coefficients in the circuit block B2.

Subsequently, there is a multiplication of the weighted signals $w_{m_1}(n) \ldots w_{m_{k+1}}(n)$, $u_{m_{k+2}}(n) \ldots u_{m_{2k+1}}(n)$ and the summation thereof in accordance with equation (21).

Figure 3A:
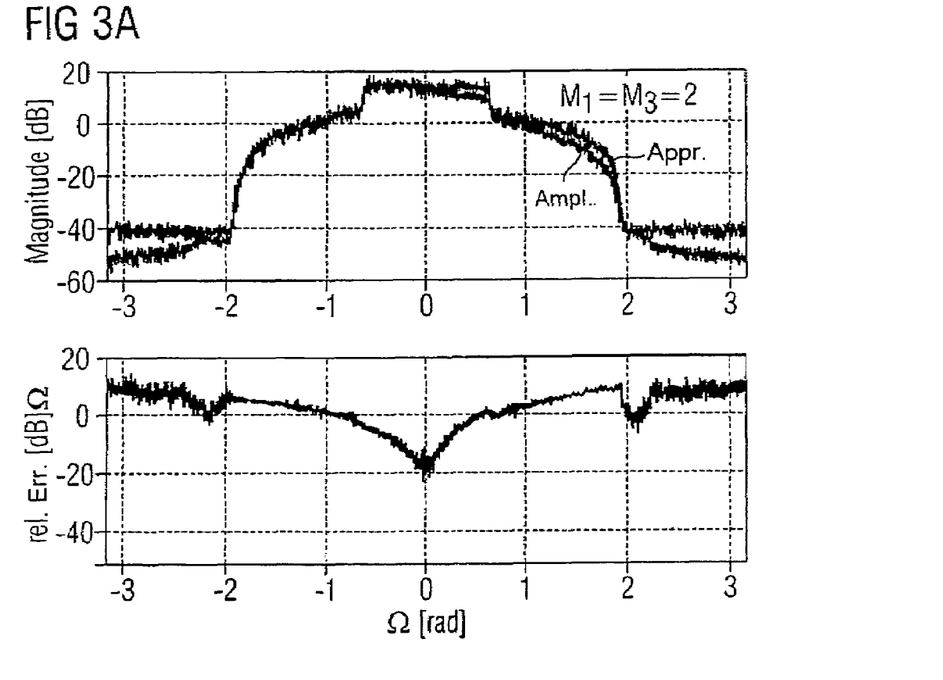
FIG. 3A illustrates a simulated spectral power density and a relative error of an electrical network approximated by a static model.
Figure 3B:
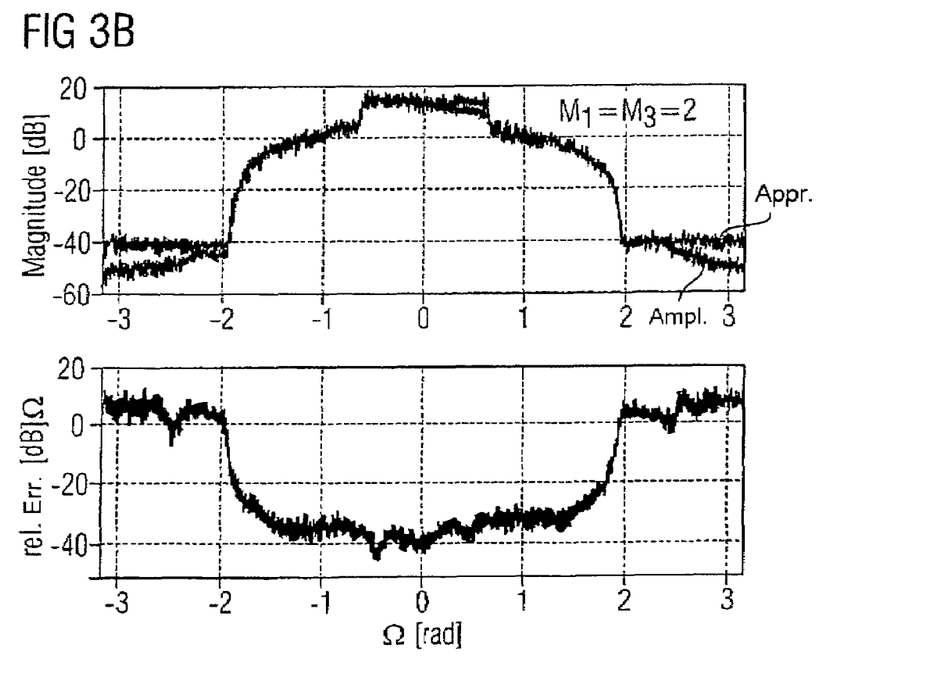
FIG. 3B illustrates a simulated spectral power density and a relative error of an electrical network approximated by a system with memory as disclosed herein.

The model determined with a system with memory exhibits, with respect to broadband input signals, a significantly better behavior than a "quasi-memoryless" model, which processes the static nonlinearities. This is illustrated in FIGS. 3A and 3B. FIG. 3A represents the difference in the spectral densities of the real power amplifier and the quasi-memoryless model "rel. error". It is evident that the error is small around the center frequency; it increases greatly in the case of relatively large deviations in the frequency. By contrast, in FIG. 3B the relative frequency error is low over the entire signal range.

Finally, FIG. 5 illustrates a schematic representation of a learning architecture such as can be used for example in a base station. The learning architecture contains a predistorter 110, in which coefficients for a predistortion are intended to be stored. The predistorter 110 is connected on the output side to a block 1 with an amplifier situated therein. The block 1 and essentially the power amplifier integrated therein have a nonlinear dynamic transfer response. In order to determine a suitable predistortion, the inverse transfer function of the block 1 is determined. The predistortion coefficients can be determined therefrom. For this purpose, the output of the block 1 is connected to a block 2, which essentially maps a model that has been expanded according to the method described above. In this example, the model corresponds to the predistorter 110.

The block 2 contains circuit elements which simulate an inverse transfer function of a desired transfer response of the block 1. The circuits in the block 2 are adjustable by means of different parameters that can be fed in at the control input 22. The output 21 of the block 2 is coupled to a comparator 3, which is connected by a second input to the input of the electrical network 1 for feeding in the baseband input signal $\tilde{x}(t)$. The comparator 3 compares the signal L that is generated and output by the model 2 with the input signal $\tilde{x}(t)$ and from this determines new settings for the individual parameters of the block 2. These are fed to the model in the block 2 at the control input 22.

In a learning phase, the predistorter 110 is inactive and an undistorted input signal is fed to the block 1 with the amplifier. Said input signal is processed by the block 1. The output signal AS is then processed further by the model in the block 2. The output signal of the block 1 serves as input signal. Since the model in block 2 is intended to approximate the inverse transfer function of the block 1, in one example an approximation the output signal L of the model should correspond to the baseband input signal $\tilde{x}(t)$ fed into the block 1. In another example, a comparison in the comparator 3 yields a difference for example in the amplitude and/or in the phase. Parameters are derived from the difference and are fed to the block 2.

The procedure is carried out until a comparison of the signal L output by the block 2 with the input signal $\tilde{x}(t)$ in the comparator 3 yields a difference that is less than a predetermined limit value. In this case, the model in block 2 accurately maps the inverse transfer function. The parameters necessary for approximation can then be accepted into the real predistorter 110. A check can subsequently be carried out. The predistorter then distorts the signal present at the input 130a with the coefficients determined and then feeds it to the electrical network 1.

The learning architecture can also be suitably approximated by the represented method for determining a model for an electrical network having a dynamic nonlinear transfer response. In this case, too, an approximation is possible in a simple manner by a representation of the model with baseband Volterra integrals in the frequency domain and subsequent expansion of the Volterra kernels with orthogonal functions that are multidimensional in the input signal range. The approximation leads to a model having a small number of adjustable parameters which accurately maps the transfer response in the input signal range.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, "exemplary" is merely intended to mean an example, rather than "the best".

LIST OF REFERENCE SYMBOLS

| | |
|---|---|
| 1: | Electrical network |
| 2: | Learning architecture |
| 3: | Comparator |
| 11: | Output |
| 20: | Signal input |
| 21: | Signal output |
| 22: | Control input |
| 25: | Control output |
| 100: | Baseband unit |
| 110: | Predistorter |
| 111: | Control input |
| 120: | Modulator |
| 130, 130a: | Input |
| 200: | Mixer |
| 210: | Input |
| 300: | Power amplifier |
| 310: | Output |
| FH: | Operator |
| LF1: | Linear filter |
| B2: | Circuit block |
| TX', AS: | Output signal |
| TX, ES: | Input signal |
| L: | Signal |
| VK: | Predistortion coefficients |
| $\tilde{x}(t)$ | Baseband input signal |
| $\tilde{y}$: | Output signal |

The invention claimed is:

1. A method for determining a model for an electrical network, comprising:
   providing an electrical network having an input for feeding in an input signal having an input signal bandwidth, having an output for outputting an output signal, the electrical network having a nonlinear transfer response and a transfer bandwidth that is greater than the input signal bandwidth;
   assigning a model input signal having a model signal bandwidth to the input signal;
   assigning a system with memory to the electrical network, the system with memory having a system bandwidth;
   mapping a transfer response of the system with memory in a range of the system bandwidth to the nonlinear transfer response of the electrical network, wherein the range of the system bandwidth comprises the bandwidth of the model signal bandwidth and does not equal a complete range of the system bandwidth.

2. The method of claim 1, wherein assigning a system with memory comprises:
   establishing an operator for describing the system with memory, the operator being formed as a sum of a number of individual terms and the number of terms specifying an order of a nonlinearity which is equal to an order of the nonlinear transfer function; and
   mapping the operator in the range of the system bandwidth by expanding the terms with functions.

3. The method of claim 2, wherein mapping a transfer response comprises:
   representing the system with memory by a Volterra series;
   expanding Volterra kernels of the Volterra series in the frequency domain by means of polynomials that are orthogonal in the range of the model signal bandwidth; and
   transforming the expanded Volterra kernels into the time domain.

4. The method of claim 1, wherein mapping a transfer response comprises:
   representing the system with memory by a Volterra series;
   expanding Volterra kernels of the Volterra series in the frequency domain by means of polynomials that are orthogonal in the range of the model signal bandwidth; and
   transforming the expanded Volterra kernels into the time domain.

5. The method of claim 4, where expanding Volterra kernels comprises at least one of orthogonal polynomials, Legendre polynomials, Chebeyshev polynomials, Fourier series, radial basis functions and multilayer perceptrons.

6. The method of claim 5, wherein assigning a system with memory comprises:
   providing a system with memory comprising a linear dynamic prefilter and a connected static nonlinearity for weighting the signals output by the linear dynamic prefilter and the combination thereof.

7. The method of claim 5, further comprising:
   feeding the model input signal to the system with memory;
   generating a model output signal by means of the system with memory; and
   determining predistortion coefficients depending on the model input signal and the model output signal.

8. The method of claim 4, further comprising:
   feeding the model input signal to the system with memory;
   generating a model output signal by means of the system with memory; and
   determining predistortion coefficients depending on the model input signal and the model output signal.

9. The method of claim 1, wherein assigning a system with memory comprises:
   providing a system with memory comprising a linear dynamic prefilter and a connected static nonlinearity for weighting the signals output by the linear dynamic prefilter and the combination thereof.

10. The method of claim 9, where, in the static nonlinearity, at least two of the signals output by the linear dynamic prefilter are multiplied by one another and summed.

11. The method of claim 10, the input signal being used as the model input signal.

12. The method of claim 10, further comprising:
   feeding the model input signal to the system with memory;
   generating a model output signal by means of the system with memory; and
   determining predistortion coefficients depending on the model input signal and the model output signal.

13. The method of claim 9, further comprising:
   feeding the model input signal to the system with memory;
   generating a model output signal by means of the system with memory; and
   determining predistortion coefficients depending on the model input signal and the model output signal.

14. The method of claim 1, the input signal being used as the model input signal.

15. The method of claim 14, further comprising:
   feeding the model input signal to the system with memory;
   generating a model output signal by means of the system with memory; and determining predistortion coefficients depending on the model input signal and the model output signal.

16. The method of claim 1, further comprising:

feeding the model input signal to the system with memory;

generating a model output signal by means of the system with memory; and determining predistortion coefficients depending on the model input signal and the model output signal.

17. The method of claim 16, wherein predistortion coefficients are determined and fed to a predistorter connected upstream of the electrical network, said predistorter being designed for the predistortion of signals depending on the predistortion coefficients.

18. The method of claim 1, wherein the electrical network comprises at least one electrical component having a dynamic nonlinear transfer response.

19. The method of claim 18, wherein the electrical network comprises a power amplifier which can be operated in an operating mode in which it has a dynamic nonlinear transfer response.

20. The method of claim 19, wherein predistortion coefficients are determined and fed to a predistorter connected upstream of the electrical network, said predistorter being designed for the predistortion of signals depending on the predistortion coefficients.

* * * * *